(12) United States Patent
Callahan

(10) Patent No.: US 7,038,677 B2
(45) Date of Patent: May 2, 2006

(54) APPARATUS AND METHOD FOR MANAGING MULTIVARIANT ASSEMBLY DATA MODELS

(75) Inventor: Sean M Callahan, Bellevue, WA (US)

(73) Assignee: The Boeing Company, Chicago, IL (US)

( * ) Notice: Subject to any disclaimer, the term of this patent is extended or adjusted under 35 U.S.C. 154(b) by 400 days.

(21) Appl. No.: 10/348,470

(22) Filed: Jan. 21, 2003

(65) Prior Publication Data

US 2004/0140976 A1    Jul. 22, 2004

(51) Int. Cl.
*G06T 15/00* (2006.01)

(52) U.S. Cl. .................... 345/419; 345/440; 706/53
(58) Field of Classification Search ............... 345/419, 345/440; 706/53
See application file for complete search history.

(56) References Cited

U.S. PATENT DOCUMENTS

| | | | |
|---|---|---|---|
| 5,119,307 A | 6/1992 | Blaha et al. | |
| 5,311,424 A | 5/1994 | Mukherjee et al. | |
| 5,434,791 A | 7/1995 | Koko et al. | |
| 6,430,730 B1 | 8/2002 | Ghatate et al. | |

FOREIGN PATENT DOCUMENTS

| | | |
|---|---|---|
| EP | 0 520 927 A2 | 6/1992 |
| EP | 1 357 486 A2 | 10/2003 |
| EP | 1 447 760 A2 | 8/2004 |
| WO | WO 86/00735 | 1/1986 |

OTHER PUBLICATIONS

Gu et al., "Product modelling using STEP," Computer-Aided Design, vol. 27, No. 3, Mar. 1995.
Fouda et al., "A Heuristic to Generate a Precedence Graph Between Components for a Product Family," M1B-3 14.10, Proceedings of the 4th IEEE, Int'l. Symposium on Assembly and Task Planning, May 28-29, 2001.
Dassault Systemes, "OMG Manufacturing Domain Task Force MDTF-RFP 1 Submission: Product Data Management Enablers Proposal," Revision 1.0, XP-002327057, Apr. 14, 1997.
Wongvasu et al., "Representing the relationship between items in logical bill-in-material to support customers' request for quotation for make-to-order products," XP-002307659, Intelligent Systems in Design and Manufacturing III, Proceedings of SPIE vol. 4192 (2000).
Wongvasu et al., "Trie Representation for Expressing the Compatibility Between Items in a Logical Bill of Material Structure," XP-002307762, Intelligent Systems in Design and Manufacturing IV, Proceedings of SPIE vol. 4565 (2001).

*Primary Examiner*—Kimbinh T. Nguyen
(74) *Attorney, Agent, or Firm*—Harness Dickey & Pierce P.L.C.

(57) ABSTRACT

A data model is provided for storing data related to multiple variants of assemblies in a computer-associated memory. A multivariant assembly data object functions as a container for component usages, logical component usages, and also for the assembly-components, each of which represents a variant of the corresponding product or assembly family. Component usages can be shared by multiple assembly-components all of which are members of the same multivariant assembly.

12 Claims, 8 Drawing Sheets

APPARATUS AND METHOD FOR MANAGING MULTIVARIANT ASSEMBLY DATA MODELS

FIELD OF THE INVENTION

The present invention relates generally to data models and in particular to data models for sharing component usages and logical component usages among the configurations of a multiple variant assembly.

BACKGROUND OF THE INVENTION

Design and manufacture of complex machines invariably presents a wide variety of engineering challenges. Complex products, structures or facilities like aircraft, ships, off-shore oil drilling platforms and computational genomic structures are typically constructed using hundreds or thousands of mechanical, electrical and other assemblies, which in turn are comprised of numerous individual components or subassemblies. Collecting and managing data about such assemblies is required to streamline the design and manufacturing process of the product, structure or facility. The need for such data about the given structure or facility becomes critical in designing variants, improvements, or additional subsystems for the given structure/facility. Computer based systems for collecting and managing such assembly related data provide an efficient solution to such problems.

The data about multiple assemblies, if collected by a computer-based system, can be very useful in a virtual product designing process. The design and testing of products in a virtual environment (on the computer) will allow designers to greatly reduce highly expensive physical prototyping and testing of the product. Virtual product design environments can save significant costs and time required for designing a given product, machine or facility. Design efficiency in a virtual environment will be enhanced when a critical fraction of product design assembly data can be both captured in computer based systems and shared between the members of common product families; for example, a passenger transport aircraft versus a freighter.

Computer Aided Drafting or Computer Aided Design (CAD) has replaced drafting as the preferred method of designing products, especially complex products having a large number of parts and assemblies. CAD tools do not allow substantial sharing of or have only limited capability to share design data between the design variants in product families. Lack of sharing functionality leads to substantial duplication of assembly-level, product design data stored in CAD files and even in product data management systems, because the same or essentially the same drawing is replicated multiple times in the data base. Recreating the drawing increases the likelihood that errors will occur and makes updating changes to the drawing a multi-step process that is often tedious and subject to introduction of errors. Hence, there is a need for a data model that promotes substantial design data sharing.

An "assembly," as used in this description, is an aggregation or combination of the component parts (i.e., "details") of a mechanism, machine or device. More generally, in the context of this invention with respect to design, an "assembly" is defined as a general, aggregate design that is composed of instances (or uses) of other independent designs. The only constraint is that any assembly can never be a child of itself at any level of assembly definition. Components have various characteristics like shape, size, strength, materials, etc., that vary depending upon design domain. For illustrative purposes, these descriptions will focus on, but are not limited to, the mechanical design domain.

The term "component" is generally used hereafter to refer to a design in any domain. The term "assembly" may also be used when a "component" itself represents the integration of several components into an assembly, often referred to as a "subassembly," such as an engine in a car. Since the information regarding which subassemblies or components are used by each higher tier assembly is important information, it is critical that computer-based systems optimally manage stored product data. Such stored product data may include Component Usage (CU) information in addition to the regular component information about the component characteristics. CU information associated with a given assembly is a data unit or object that indicates that the assembly includes (or uses) another component that may be either an assembly or a leaf level design, like a simple mechanical part.

Component usage information links a component to an assembly definition. If two of the electrical assembly variants require the same type of motor but with different power ratings, then two distinct CUs would be used to include the two different motors on the design, even though they are essentially fulfilling the same role on the assembly. To capture that additional crucial information, an additional data unit is required to capture the "role" that is fulfilled by distinct components across the assembly variants.

Capture of such "role" related information is achieved through the use of the Logical Component Usage (LCU) product data concepts that were disclosed in U.S. patent application Ser. No. 10/128,922 titled "A Logical Hierarchical Data Model for Sharing Product Information Across Product Families," which is incorporated by reference. The LCU is a data unit or object that relates to one or more CUs to indicate that they play a common role in their parent assemblies, which are distinct variants of an assembly or product family.

An example below illustrates the LCU concept. A hydraulic assembly has two variants, where a first hydraulic assembly variant requires a large pump and a second hydraulic assembly variant requires a small pump. The pumps required by both variants are broadly of similar type except for the obvious differences in their capacities. The CU for the large pump will indicate that it is required in the first variant and the CU for the small pump will indicate that it is required for the second variant. A LCU, labeled as "pump", would relate the above two CUs to indicate that they play a common role within the design or architecture of the multivariant hydraulic assembly. To summarize, a LCU captures the logical role that must be fulfilled by a component usage, while a CU just captures the inclusion of a component in an assembly.

The data model using CUs and LCUs for component data provides significant advantages. However, a need still exists for a multivariant assembly data model, which can provide precise control over the specification and content of each product configuration, while sharing as much of the common definition as possible.

SUMMARY OF THE INVENTION

An apparatus and method for managing multivariant assembly data models is provided that captures the overall architecture of a product family. The system and method provides a data model that relates assembly-component objects to associated component usage objects, and component usage objects to logical component usage objects. Both logical component usage objects and the assembly-component objects are related to the multivariant assembly object. The assembly-component is capable of representing a multicomponent assembly, an indivisible component, or a generic component. Each such assembly-component, except for a generic assembly, represents a single variant assembly. Different variants, which are members of the same multivariant assembly, can share component usages. Appropriate software modules are used to create, store and access the multivariant assembly data model in a memory associated with a computer, or in a database or product data management system.

Further areas of applicability of the present invention will become apparent from the detailed description, which, with the specific examples, are intended for purposes of illustration only and are not intended to limit the scope of the invention. In particular the present invention is not limited to the domain of mechanical assemblies, and applies to any domain in which reusable designs of any sort are composed of (or use) lower-level designs that are members of a design family. Potential design domains include, but are not limited to: simulation models, detailed systems designs and manufacturing build plans and assembly sequences.

BRIEF DESCRIPTION OF THE DRAWINGS

The present invention will become more fully understood from the detailed description and the accompanying drawings, wherein.

DETAILED DESCRIPTION OF PREFERRED EMBODIMENTS

The following description is merely exemplary in nature and is in no way intended to limit the invention, its application, or uses.

Data models discussed below are of general applicability to any design domain in which designs defined independently at one level are used by designs at a higher level. For example, design domains may include, but are not limited to, product simulations, detailed systems designs, three-dimensional computer aided design, manufacturing assembly sequence plans, molecular biological system design and virtual world designs.

Figure 1:
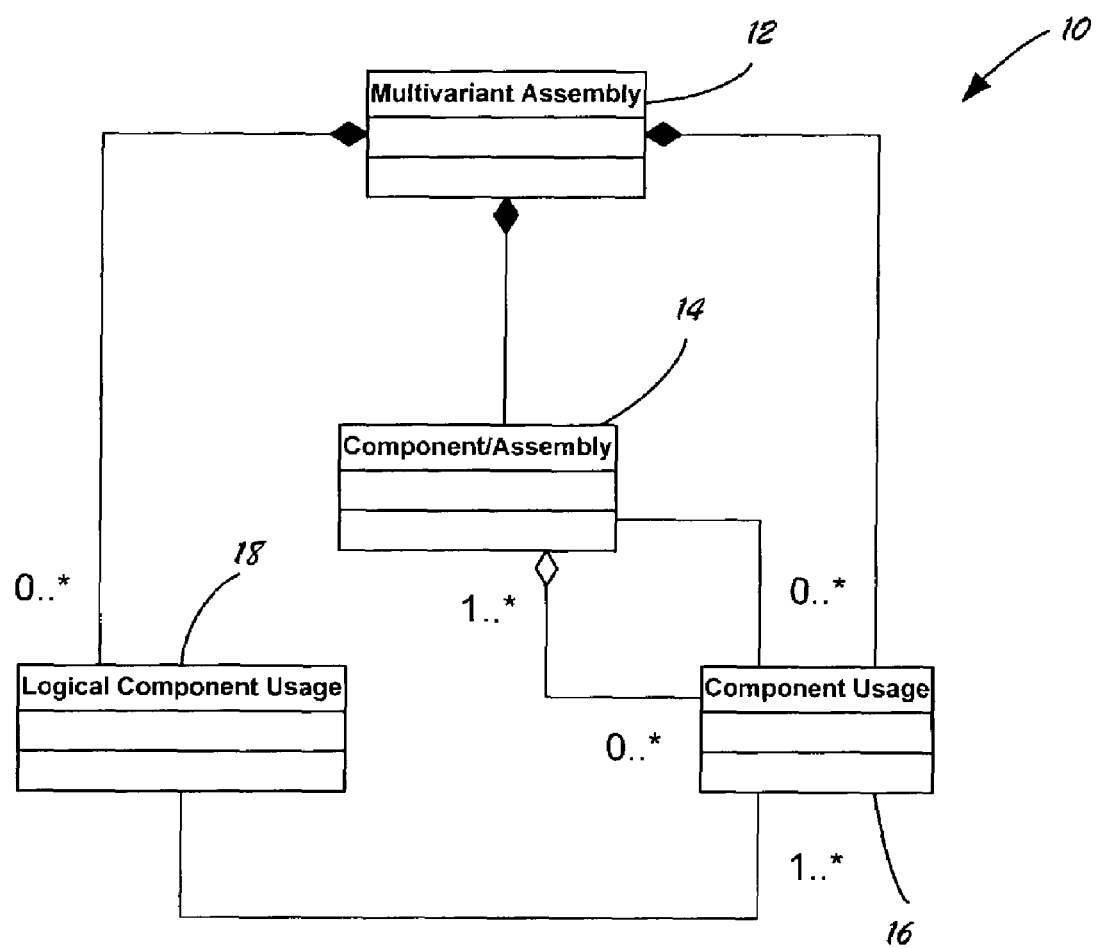
FIG. 1 is a Unified Modeling Language (UML) diagram for the set of class definitions, instances of which capture precise multivariant assemblies.

FIG. 1 shows a Unified Modeling Language (UML) diagram 10 in accordance with a preferred embodiment of the present invention, for use with a multivariant assembly class 12. The UML representation 10 provides a more detailed representation view of the multivariant assembly class 12. The multivariant assembly class 12 is an aggregation of zero or more component usage (CU) assembly class 14 instances along with zero or more logical component usage (LCU) class 16 instances and at least one component-assembly (CA) class 14 instance. Component-assembly class 14 instances can represent either indivisible components, e.g., a screw, or an assembly, e.g., a fastner assembly containing screws, clamps, nuts, bolts and other components, or a generic component set. Thus, the term "component-assembly" is a general term to indicate that the component-assembly may be an assembly, i.e., an aggregate of components, just an indivisible component by itself or a generic component.

Generic components represent groups of assemblies or components that are completely interchangeable between product designs. Each member of the group is assigned applicability attributes, so that the selection of the particular group member that goes on a given product configuration may be delayed until end-product configuration time. An example of such a generic component might be the selection of a radio for a particular model of an automobile. If there are five completely interchangeable radio choices then it wouldn't make sense to have five complete design configurations captured, one for each choice of radio.

The generic radio component allows otherwise precise product configurations to describe multiple product configurations that have the above stated design independence. An appropriate selection mechanism can be used to select a particular component from the set of components represented by the generic component. For example, an applicability mechanism can be used as a selection mechanism where it includes but is not limited to schemes such as effectivity and option-based part selection.

Instances of the component-assembly class are shown as squares with sharp corners when they represent indivisible components, and they are drawn with round corners when they represent assemblies.

It should be noted that the terms "component," "assembly" and "subassembly" are relative. For example, a pump will be a component in a given compressor system, but the same pump by itself is also an assembly made up of several components including a motor, an entrance port and an exhaust port, etc. The multivariant assembly class 12 is designed to allow easy and flexible representation of families of assemblies in component structures in computer based product data management systems.

At the minimum, an instance of the multivariant assembly class 12 contains just one instance of an assembly-component class 14. However, a typical example of the multivariant assembly class 12 will have multiple instances of assembly-component class 14, and several associated instances of the component usage class 16, and one or more instances of logical component usages 18. The multiple variants, as represented by the instances of the assembly-component class 14 within the multivariant assembly class 12, differ by containing distinct child CUs and, further, by having distinct child CUs that aren't contained in common LCUs. Conversely, they are similar to the extent that they either share child CUs or have distinct child CUs that are contained by common LCUs.

Representation structures for assemblies, CUs and LCUs are described next.

Figure 2A:
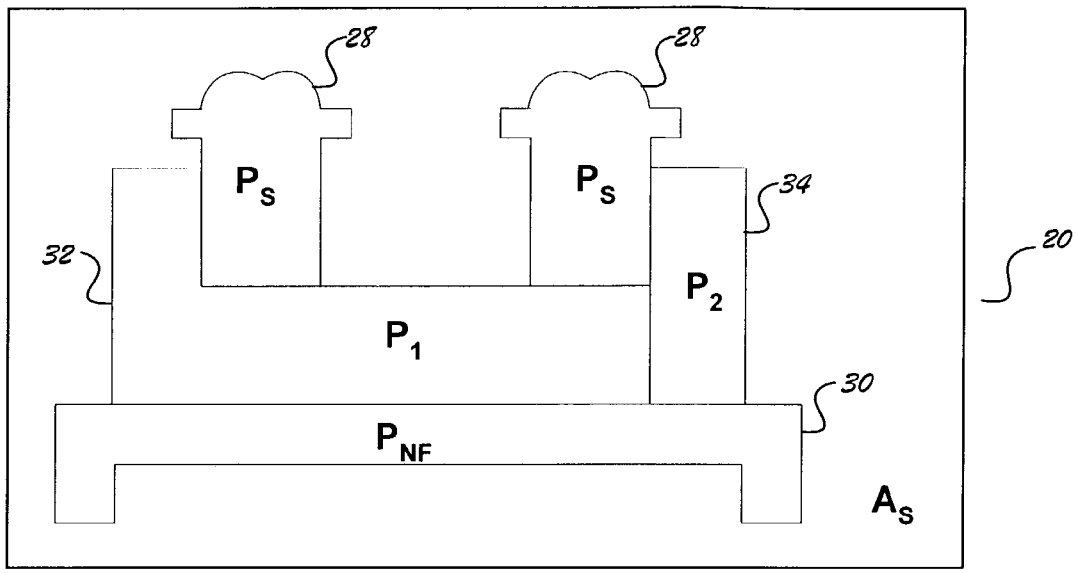
FIG. 2A shows an exemplary small pump assembly.
Figure 2B:
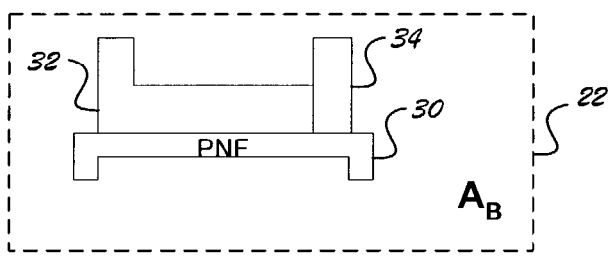
FIG. 2B shows a base assembly that is used to build the small pump assembly.
Figure 2C:
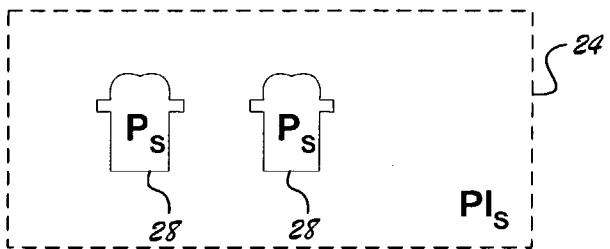
FIG. 2C shows a small-pump installation that is used to build the small-pump assembly.
Figure 2D:
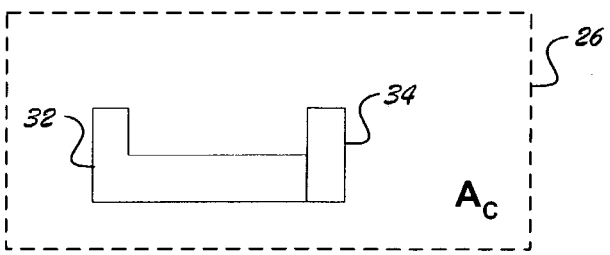
FIG. 2D shows a cradle assembly that is used to build the base assembly.

FIGS. 2A–2D are prior art representations of the various assemblies included in a single variant design of an exemplary hydraulic assembly. FIG. 2A shows a first assembly variant 20 using small-pumps 28; FIG. 2B shows a base assembly; FIG. 2C, shows a small pump installation 24; and FIG. 2D shows a cradle assembly 26. The examples below will describe four variations of this hydraulic assembly, only one of which is being described in these Figures.

The first assembly variant 20 of the hydraulic assembly is labeled as "$A_s$" (FIG. 2A). The first assembly variant 20 consists of the base assembly 22, which is labeled as "$A_B$" (FIG. 2B) and the pump installation 24, which is labeled as "$PI_s$" (FIG. 2C). The base assembly 22 includes the cradle assembly 26, which is labeled as "$A_C$" (FIG. 2D) and a support component 30. Cradle assembly 26 includes a L-shaped component 32 labeled as "$P_1$" and a vertical component 34 labeled as "$P_2$". The term "installation" generally indicates a non-self-supporting assembly. The pump installation 24, in the present example, consists of two small pumps 28, each of which is labeled as "$P_S$". The two-dimensional view of the assembly variant 20 is helpful in getting a quick overview of the assembly structure. However, for designing a computer-based system, the assembly designs are even better represented as reusable assembly graphs, as described next.

Figure 3:
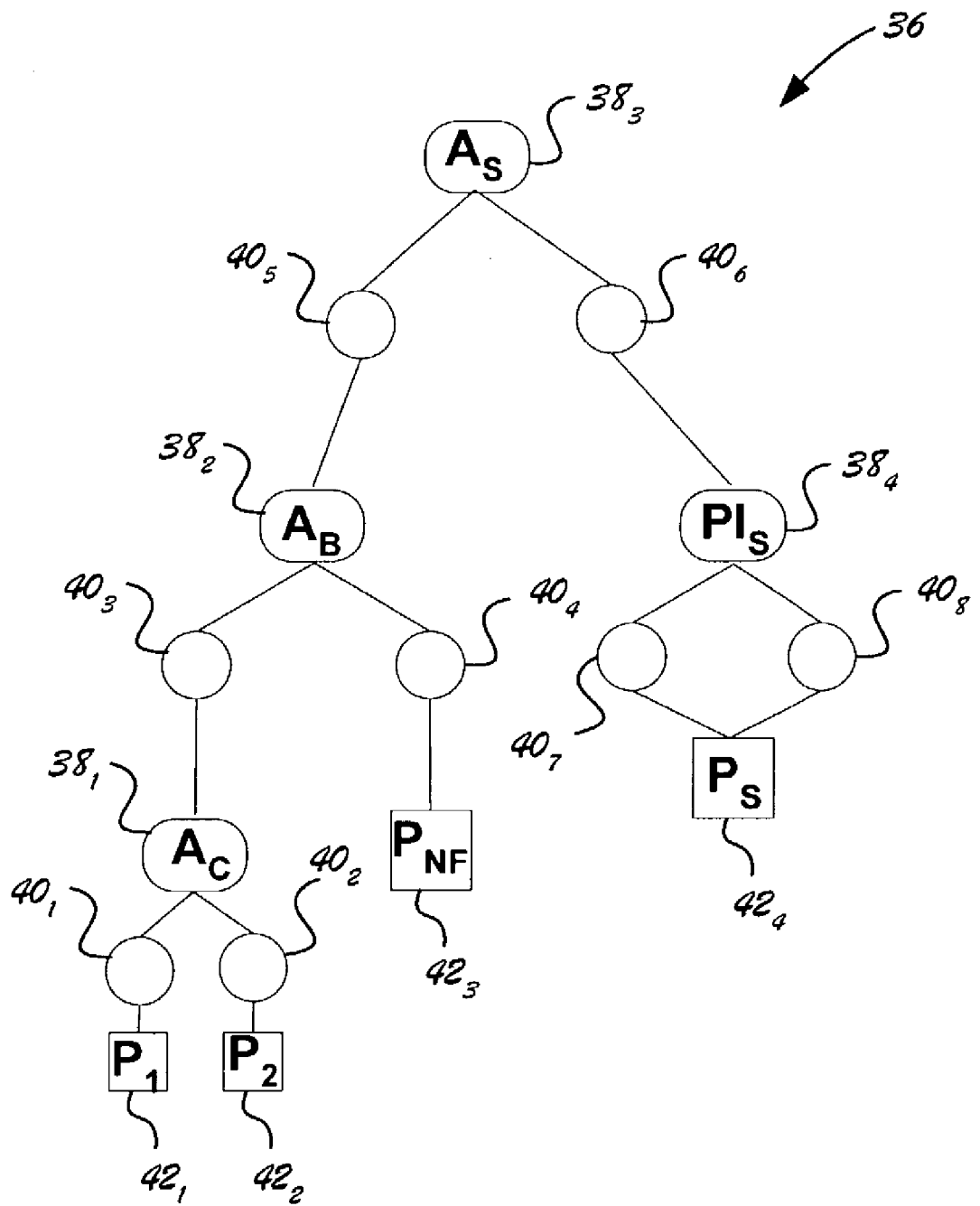
FIG. 3 is a prior art reusable assembly graph for a variant of a hydraulic assembly using small pumps.

FIG. 3 is a prior art reusable assembly graph for a variant of the hydraulic assembly shown in FIG. 2 that uses small pumps. Reusable assembly graphs are constructed using nodes representing components, CUs and LCUs. The small pump variant of the hydraulic assembly is shown in the form of a first reusable assembly graph 36. Square boxes in the first graph 36 represent indivisible components, circles represent CUs, and the ovals represent assembly components. The first graph 36 is described in detail next.

First graph 36 is described in a bottom-up manner. For the purpose of clarity, each one of the individual assembly nodes 38, component usage nodes 40 and component nodes 42 are distinguished by subscripts. Assembly node $38_1$ represents the cradle assembly 26. A component usage node $40_1$ links the component node $42_1$, which represents the L-shaped component 32, to the assembly node $38_1$. Similarly, a component usage node $40_2$ links the component node $42_2$, which represents the vertical component 34, to the assembly node $38_1$.

An assembly node 382 represents the base assembly 22 in the first graph 36. Assembly node $38_2$ is linked to the assembly node $38_1$ via a usage node $40_3$. Assembly node $38_2$ is also linked to a component node $42_3$, which represents the support component 30, via a usage node $40_4$. Hence, a downward traversal of the first graph 36 from the assembly node $38_2$ would yield the information that the base assembly 22 can be constructed using one cradle assembly 26 and one support component 30.

An assembly node $38_3$ is the highest level node in the first graph 36. Assembly node $38_3$ represents the overall first assembly variant 20. Assembly node $38_3$ is linked to the assembly node $38_2$ via a usage node $40_5$ and also to assembly node $38_4$ via usage node $40_6$. The assembly node $38_4$ is linked to two usage nodes $40_7$ and $40_8$, respectively, which in turn are linked to a component node $42_4$ representing the small pump 28. Hence, the first graph 36 provides a hierarchical data model for storing relationships between multiple assemblies and the components that define the contained assemblies.

Figure 4A:
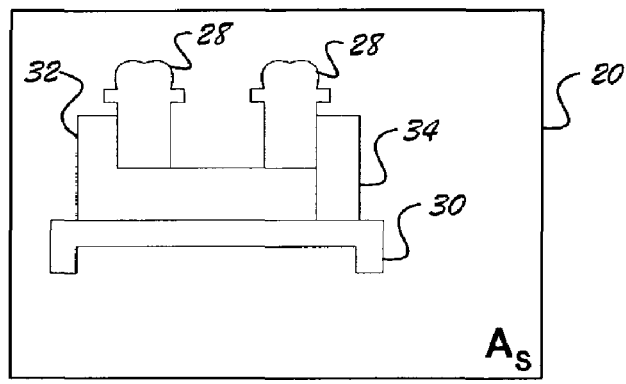
FIG. 4A shows a simplified diagram of a first assembly variant.
Figure 4B:
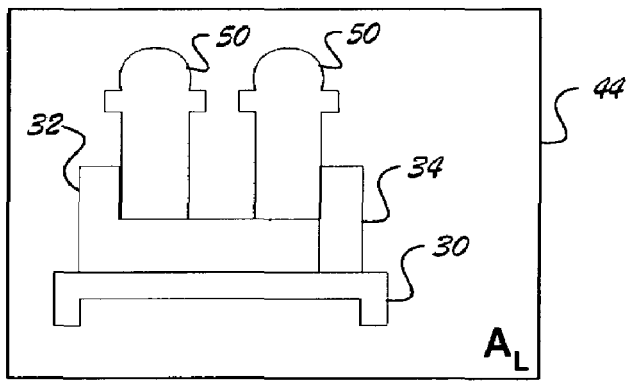
FIG. 4B shows a simplified diagram of a second assembly variant having two large pumps.
Figure 4C:
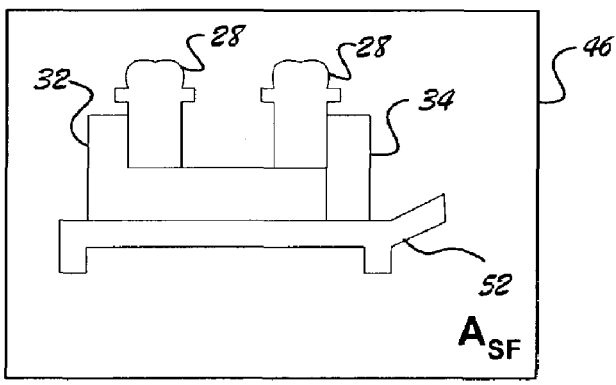
FIG. 4C shows a simplified diagram of a third variant 46 having two small pumps and a flanged base.
Figure 4D:
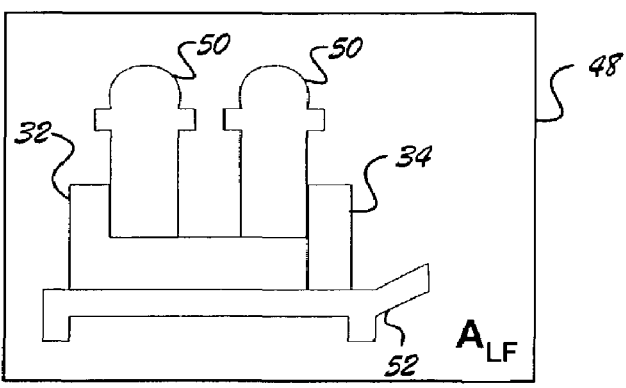
FIG. 4D shows a simplified diagram of a fourth variant 48 having two large pumps and a flanged base.

FIGS. 4A–4D show four variants of the exemplary pump assembly. Generally, a given assembly can have multiple variants that differ in some respects while having significant common content across the variants. FIGS. 4A–4D depict four variants of the given pump assembly. FIG. 4A shows the first assembly variant 20 that was discussed above in the context of FIG. 2A; FIG. 4B shows a second assembly variant 44 having two large pumps 50; FIG. 4C shows a third variant 46 having two small pumps 28 and a flanged base 52; and FIG. 4D shows a fourth variant 48 having two large pumps 50 and the flanged base 52.

The four assembly variants 20, 44, 46 and 48 share many common components. For example, the L-shaped component 32 and the vertical component 34 are included in all four assembly variants 20, 44, 46 and 48 respectively. The support component 30 is shared by the first and second assembly variants 20 and 44. Similarly, the third assembly variant 46 and fourth assembly variant 48 share the flanged base 52 as a common part. Further sharing can be noticed from the fact that the first assembly variant 20 and the third assembly variant 46 use two small pumps 28, while the second assembly variant 44 and the fourth assembly variant 48 use two large pumps 50. In addition, all four assemblies share a common architecture that, at the top level, consists of a base assembly and a pump installation.

A computer system capable of capturing all the above details of common parts or variations in parts across assembly variants would prove to be very useful in a virtual environment design application. A product designer needs to have the ability to easily reuse the existing assembly definitions for creating a new assembly variant, without unnecessarily duplicating design data. Also, the product designer can find new applications for the existing assembly definition in a new, larger assembly design. The present invention enables a computer to automatically calculate and present to designers the type of analysis that was described in the previous paragraph. The prior art graph shown in FIG. 5 does not have enough information to make this type of comparison for complex assembly variations.

Figure 5:
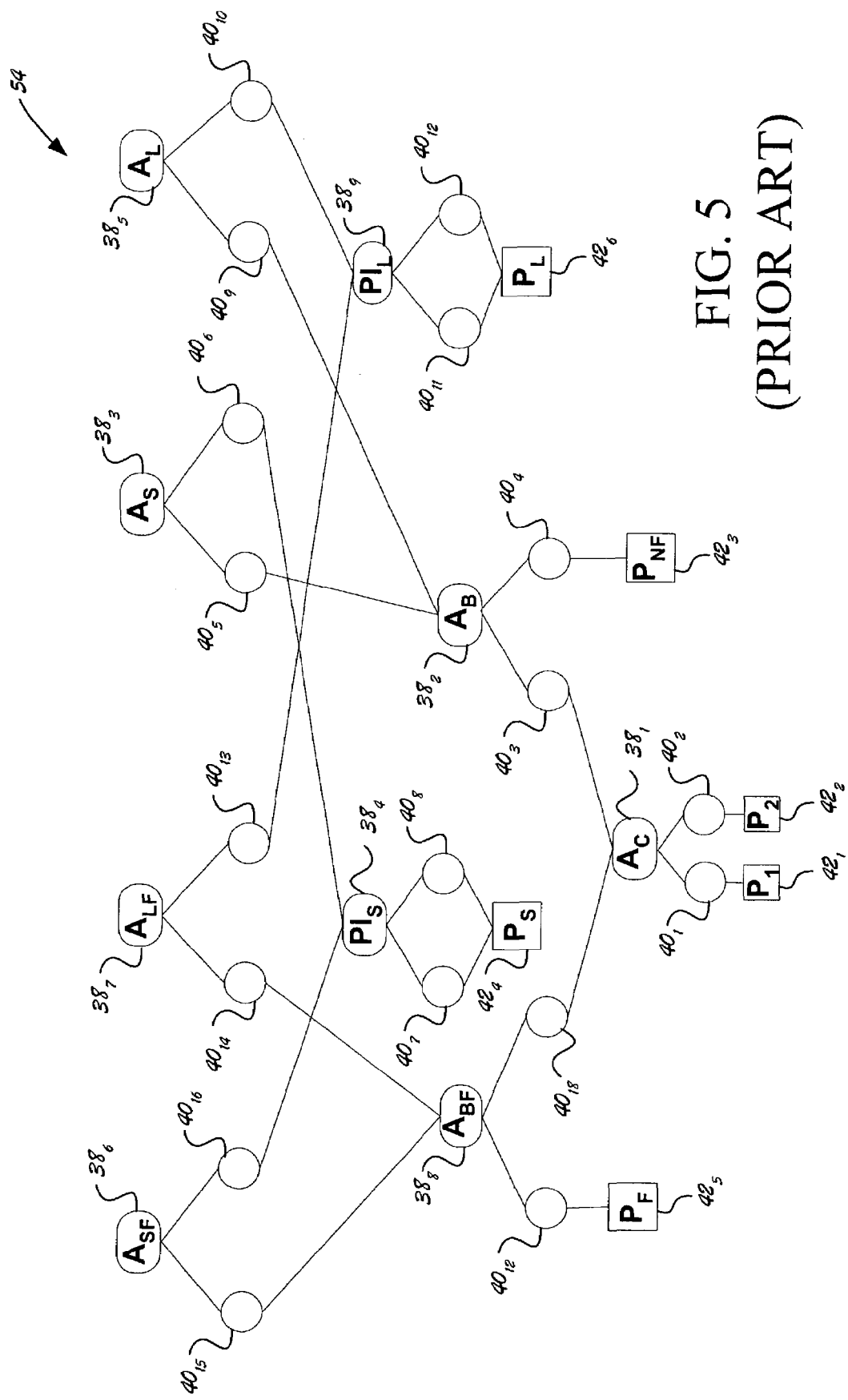
FIG. 5 is a prior art reusable assembly graph for the four variants of the pump assembly.

FIG. 5 is a reusable assembly graph for the four variants of the exemplary pump assembly. The second graph 54 relates all the parts of the four variant assemblies 20, 44, 46 and 48 that are shown in FIGS. 4A–4D. The second graph 54 also shows how common parts are shared across the common assembly variants, but does not capture the fact that, for example, CU $40_{15}$ and $40_{14}$ actually have identical meanings in the two variant designs. Usage comparison is critical to make accurate and complete statements about shared design content. The second graph 54 incorporates the first graph 36 for the first assembly variant 20, which is discussed in detail above.

The assembly node 385 represents the second assembly variant 44, shown in FIG. 4B. The component usage nodes $40_9$ and $40_{10}$ indicate that the second assembly variant requires one base assembly 22 represented by the assembly $38_2$ and a large pump installation (assembly) represented by the assembly node $38_9$. The two component usage nodes $40_{11}$ and $40_{12}$ connected to assembly node $38_9$ and component node $42_6$ indicate that two large pumps 50 are required to form the large pump installation. The component node $42_6$ represents a large pump 50.

The second graph 54 clearly shows, to a certain level of refinement, how higher level assemblies share lower level assemblies and components. The first assembly variant 20 represented by the assembly node 38$_3$ and the second assembly variant 44 represented by the assembly node 38$_5$ share the base assembly 22 represented by assembly node 38$_2$. Similarly, the large pump installation, represented by the assembly node 38$_9$, is shared by assemblies represented by the assembly nodes 38$_5$ and 38$_7$, via the component usages 40$_{10}$ and 40$_{13}$.

Assembly node 38$_6$ and 38$_7$ represent the third assembly variant 46 and the fourth assembly variant 48, which are shown in FIG. 4C and 4D respectively. The third assembly variant 46 and the fourth assembly variant 48 share a common flanged base assembly (not shown separately) represented by an assembly node 38$_8$. This sharing is effected by the distinct component usage nodes 40$_{14}$ and 40$_{15}$. While it may be deduced that the same subassembly is present in the two assembly variants, it is not clear that their role in those assemblies is identical. For example, they could be located differently in the two assemblies since the two usage nodes could contain distinct 3D locating transformations.

The two kinds of base assemblies, i.e., one with a flanged base and other with a non-flanged shape, also have some components in common. The assembly node 38$_8$ represents the flanged base assembly and the base assembly 22 (non-flanged) is represented by the assembly node 38$_2$. Both these base assemblies share a common assembly, i.e., the cradle assembly 26, which is represented by the assembly node 38$_1$, through the component usage nodes 40$_{18}$ and 40$_3$ respectively.

The second graph 54 captures a critical quantum of relationship detail across various assembly variants, which share some or many components or subassemblies. Reusable assembly graphs such as the second graph 54 provide a hierarchically structured mechanism to capture the design details of individual assembly variants, as if they were unrelated assemblies that just happen to share some part content. Reusable assembly graphs are typically supported by CAD systems. Reusable graphs are only useful, generally, for situations in which all reuse is limited to identical subassemblies.

Figure 6:
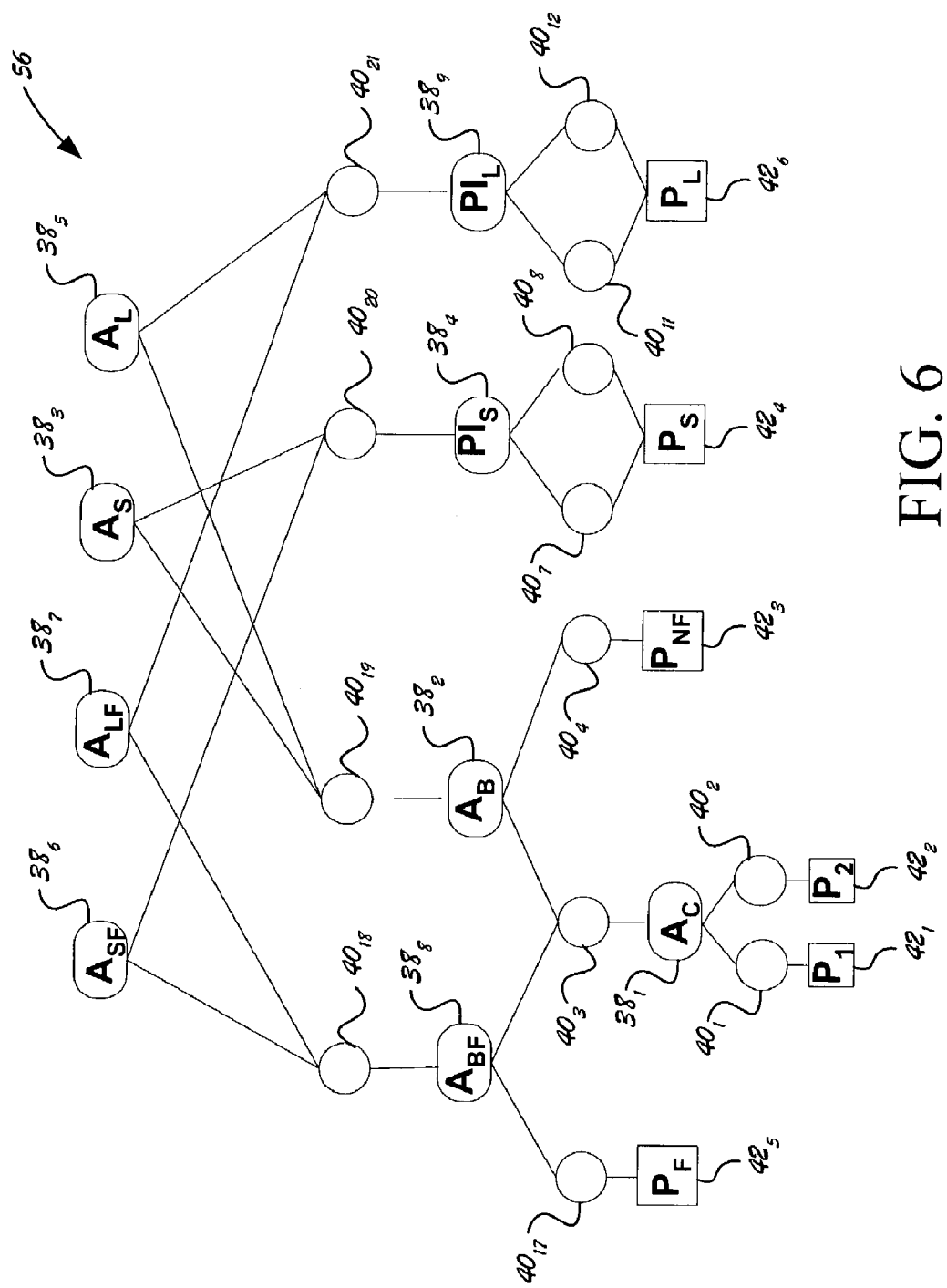
FIG. 6 illustrates that improved design data sharing is possible when component usages are shared between assembly variants.

FIG. 6 shows the improved design sharing that is possible when component usages are shared between reusable assembly graphs. The second graph 54 provides a detailed linkage of shared components to their respective parent assemblies. But the complexity of second graph 54 is a reflection of the lack of design content sharing between the four variants. A third graph 56 allows parent assemblies to share component usages for connecting subassemblies or components. For example, as described in the second graph 54 (see FIG. 5), the subassembly represented by the assembly node 38$_2$ was shared by two parent assemblies represented by the assembly nodes 38$_3$ and 38$_5$ through two distinct component usage nodes 40$_5$ and 40$_9$, respectively. However, in the third graph 56, a common component usage node 40$_{19}$ indicates that the assemblies represented by the assembly nodes 38$_3$ and 38$_5$ share the assembly represented by the assembly node 38$_2$, and that it plays the identical role (including physical location) in the two designs.

Third graph 56 provides even greater simplification of the graph structure and a higher level of reuse encoding between assemblies as compared to the previously described graphs. Third graph 56 uses the fact that the four assemblies represented by the assembly nodes 38$_6$, 38$_7$, 38$_3$ and 38$_5$ are variations of a common assembly family. This fact is developed in the description relating to the diagram of FIG. 7.

Figure 7:
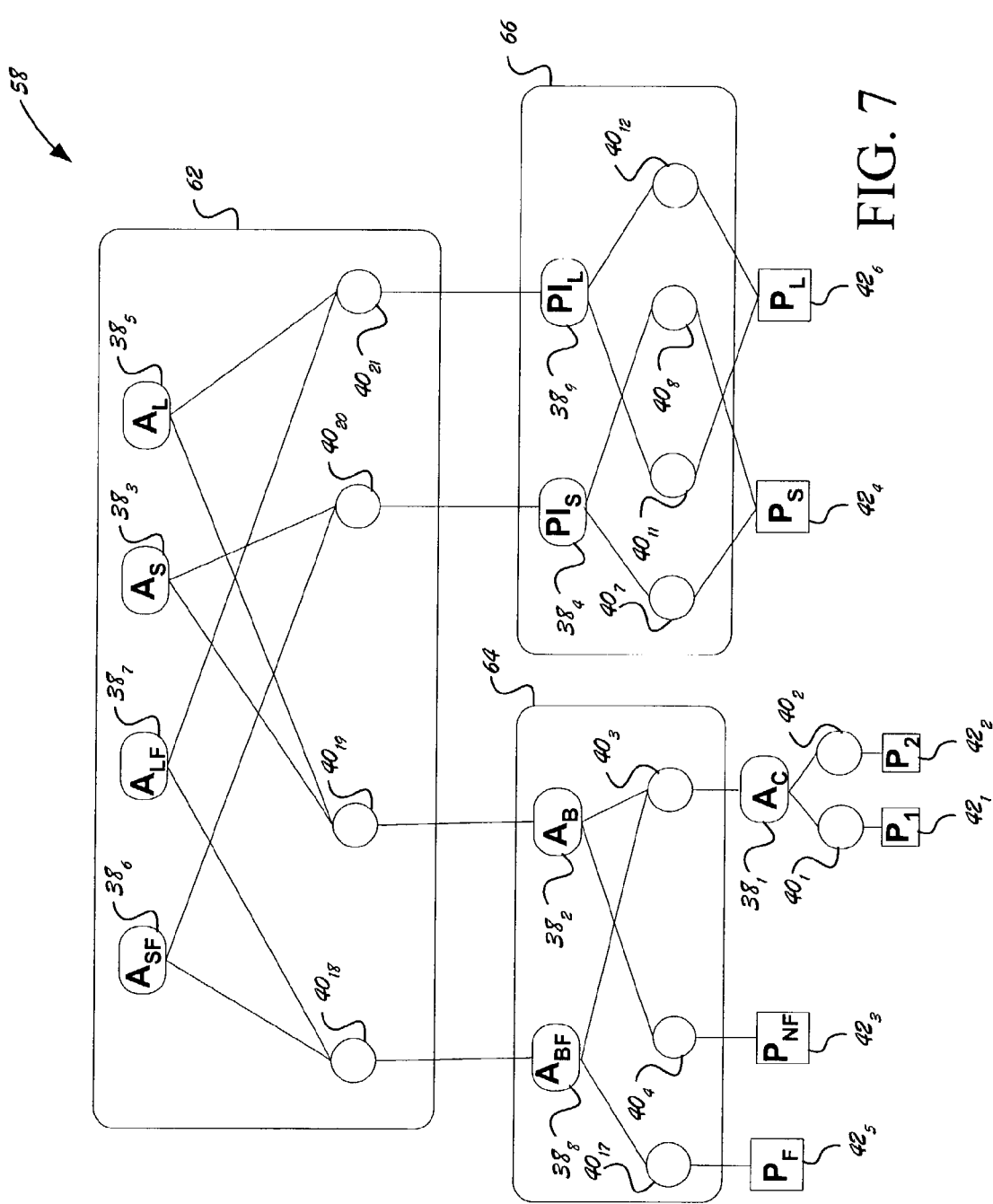
FIG. 7 shows an instance diagram of the multivariant assembly data model for the multivariant pump assembly, without logical component usages.
Figure 8:
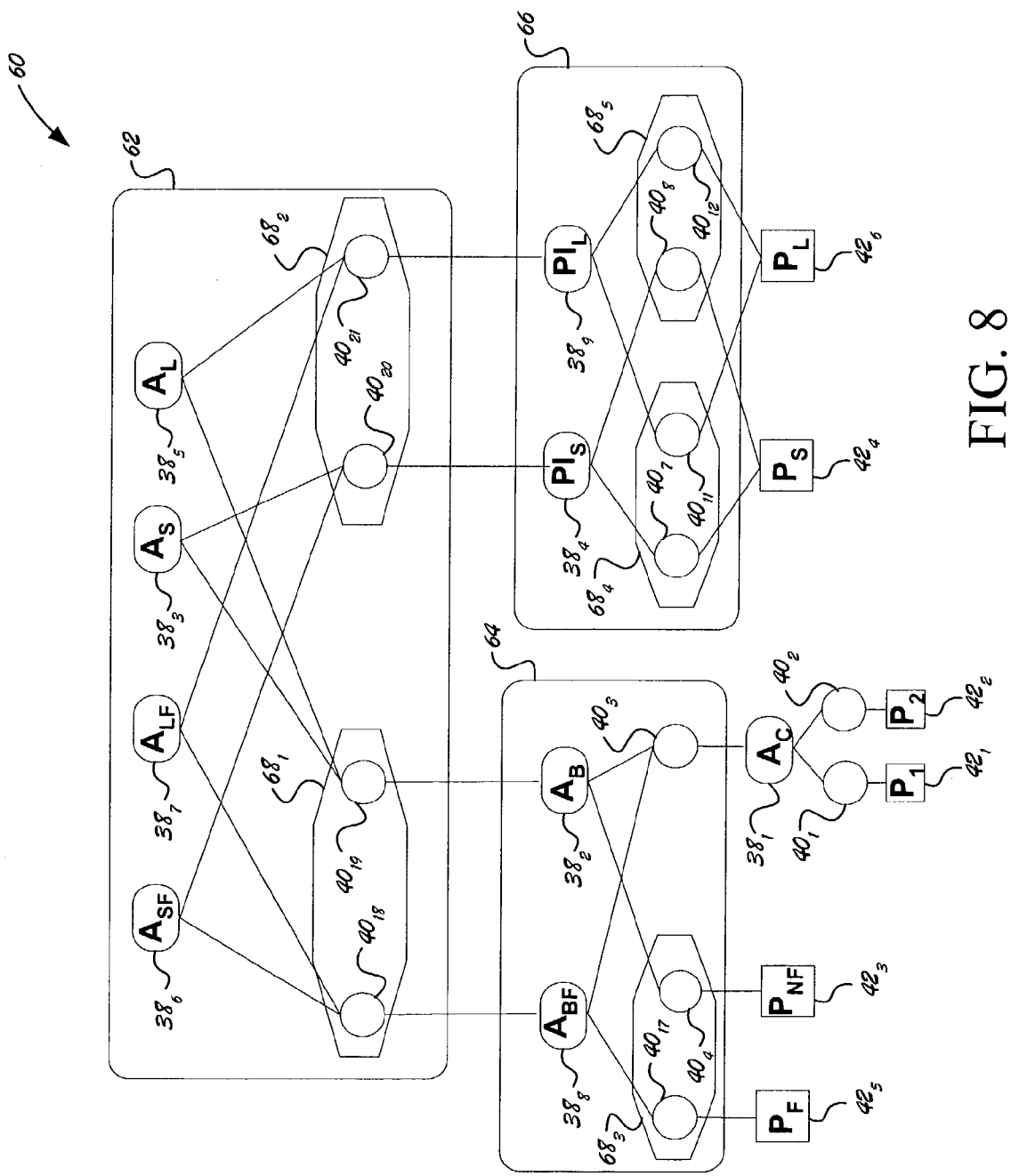
FIG. 8 adds logical component usages to the multivariant assembly instance diagram.

FIG. 7 shows an exemplary application of the multivariant design product model to the pump assembly family, but omitting the use of LCUs to simplify the discussion. FIG. 8 adds LCUs to the multivariant design product model. The fourth graph 58 factors the third graph 54 into three multivariant assemblies. Multivariant assemblies preferably require a structural rule to be followed such that assemblies may only share a common component usage if they are members of a common multivariant assembly.

The fourth graph 58 shows an exemplary MultiVariant Assembly (MVA) graph 60 that includes three assemblies, i.e., a pump MVA 62, base MVA 64, and pump installation MVA 66. Multivariant assemblies enable the sharing of component usages among assemblies. A parent level MVA can share constituent assemblies when its member assemblies share common component usages. For example, the pump MVA 62 includes the assembly nodes 38$_6$ and 38$_7$, which share a common component usage 40$_{18}$.

The primary requirement for components to share component usages is that they preferably are all members of a common MVA. For example, assembly nodes 38$_8$ and 38$_2$ are both part of the base MVA 64, and both of the two assembly designs represented by those nodes include an occurrence of the end component represented by the component node 42$_2$. The component usage node 40$_2$ associated with the component node 42$_2$ cannot be directly associated with (or used by) either assembly nodes 38$_8$ or 38$_2$, because the component usage node 40$_2$ is not a member of the base MVA 64. In contrast, component usage 40$_3$ can be shared by both the assembly nodes 38$_8$ and 38$_2$, because they are members of a common multivariant assembly.

FIG. 8 shows an application of the multivariant design product model to the pump assembly product family, with the addition of LCUs. Including LCUs enhances the utility of the MVA representation. LCUs capture or encapsulate common roles played by distinct CUs that are included in the components that are variations of a MVA. For example, the logical component usage (LCU) node 68$_1$ indicates that the components linked to the component usage nodes 40$_{18}$ and 40$_{19}$ fulfill a common role or function of a base within the pump MVA 62. Similarly, LCU node 68$_2$ indicates the role of pump installation; LCU node 68$_3$ indicates the role of a stand; LCU node 68$_4$ indicates the role of a left side pump (irrespective of the size of the pump); and LCU node 68$_5$ indicates the role of a right side pump. LCUs encapsulation or indication of the role of the component usage provides information regarding many aspects, nonlimiting examples of which are common use, function or purpose of the component usages.

The present invention can be implemented as a software system, module, component, data base or product data management system running on a suitable computer. The MVA data model is typically stored in a nonvolatile or volatile memory associated with a computer. Appropriate software modules can be created to store, access and erase or delete the data stored in the multivariant assembly data model. Many other software modules apart from the above ones will be typically created in a product data management software program that accesses, manipulates, processes and modifies the present data-model.

The present invention thus involves creating in computer memory (volatile or nonvolatile) various data-units that are instances of the data model classes: In particular, they are instances of the multivariant assembly class, the component usage class, the component-assembly class and the logical component usage class. These and other such data entities may generically be termed as "data-units," and will be called objects or class instances, here. Such class instances can be implemented in a variety of ways, for example, as objects in an object-oriented environment, as variables, as data-structures, types, records, database members, etc. Depending upon individual implementation, such data-units will need appropriate methods, functions, routines, procedures, etc. for manipulating the data model and the data-units, which can be constructed using the principles of the present invention.

The description of the present invention is merely exemplary in nature and, thus, variations that do not depart from the gist of the invention are intended to be within the scope of the invention. Such variations are not to be regarded as a departure from the spirit and scope of the invention.

What is claimed is:

1. A data-model adapted to be stored in a computer associated memory, the data-model capable of representing a multivariant assembly having multiple variants that differ in predetermined respects, the data-model comprising:
    a multivariant assembly class instance that operates as a data container for other class instances;
    a component/assembly class instance for storing data related to at least one variant of said multivariant assembly class instance, said component/assembly class instance being related to said multivariant assembly class instance;
    a component usage class instance for storing data related to at least one component usage that is an instance of at exactly one and only one child component/assembly that is used in said variant of said multivariant assembly class instance, said component usage class instance being related to said variant component/assembly class instance; and
    a logical component usage class instance for storing data related to said component usage class instance, said logical component usage class instance being related to said multivariant assembly class instance and said component usage class instance, and having a rule that whenever a variant component/assembly of said multivariant assembly class instance is created that said variant component/assembly class instance must connect to exactly one component usage class instance that is related to said logical component usage class instance.

2. The data-model of claim 1, wherein said component-assembly comprises at least one component.

3. The data-model of claim 1, wherein said component-assembly comprises at least one assembly including at least two components.

4. The data-model of claim 1, wherein said component-assembly comprises at least one generic component having a plurality of component variants.

5. The data-model of claim 4, further comprising a selection mechanism to select at least one of said component variants related to said generic component.

6. The data-model of claim 1, wherein said component usage class instance is operatively shared by at least two said component-assemblies that are variants and members of said multivariant assembly class instance.

7. The data-model of claim 1, wherein data related to said multivariant assembly class instance is stored in a graph data-structure stored in a memory, the graph data-structure comprising:
    a multivariant assembly (MVA) node corresponding to said multivariant assembly class instance;
    a component-assembly node corresponding to said component-assembly class instance;
    a component usage node corresponding to said component usage class instance;
    a logical component usage node corresponding to said logical component usage class instance; and
    a plurality of graph-edges connecting said component-assembly node to said MVA node, said component-assembly node to said component usage node, said component usage node to said logical component usage node and said logical component usage node to said MVA node.

8. The data-model of claim 1, wherein said multivariant assembly class instance functions as a data container for at least two variants of said multivariant assembly class instance, said at least two variants of said multivariant assembly class instance represented by at least two said component-assembly class instances.

9. The data-model of claim 1, wherein said data-model is implemented as an object-based system comprising:
    a multivariant assembly (MVA) class corresponding to said multivariant class instance;
    a component-assembly class corresponding to a component-assembly class instance and representing an assembly variant;
    a component usage class corresponding to said component usage class instance;
    a logical component usage class corresponding to said logical component usage class instance; and
    a plurality of object oriented-methods that operate on the class instances of said component-assembly class, said component usage class instance, and said logical component usage class.

10. A method for designing a family of product variants using a computer based design tool, comprising the steps of:
    creating at least one first product variant design using the computer based design tool, said first product variant design representing a product having at least one first component as part of an assembly, said first product variant design including information about said first component and a component usage of said first component;
    storing data related to said first product variant design in a first component-assembly class instance being related to a multivariant assembly class instance;
    creating at least one second variant design of said product using the computer based design tool, said second variant design including a variant of said first component;
    storing data related to said second product variant design in a second component-assembly class instance which is related to said multivariant assembly class instance;
    sharing said component usage associated between said first component-assembly class instance and said second component-assembly class instance; and
    using a logical component usage instance for capturing a common logical role of said first component-assembly in said first product variant design and said second product variant design.

11. The method of claim 10, wherein said sharing is a result of said first component-assembly class instance and said second component-assembly class instances both being related to said multivariant assembly class instance.

12. The method of claim 10, further comprising sharing of component data between said first product variant design and said second product variant design.

* * * * *